United States Patent
Beutel

(10) Patent No.: US 6,428,908 B1
(45) Date of Patent: Aug. 6, 2002

(54) CONTACT AND METHOD FOR PRODUCING A CONTACT

(75) Inventor: Hansjorg Beutel, Mühlenstr (DE)

(73) Assignee: Fraunhofer Gesellschaft zur Forderung der Angewandten Forschung e.V. (DE)

( * ) Notice: Subject to any disclaimer, the term of this patent is extended or adjusted under 35 U.S.C. 154(b) by 0 days.

(21) Appl. No.: 09/446,636

(22) PCT Filed: Jun. 27, 2000

(86) PCT No.: PCT/EP98/04412

§ 371 (c)(1),
(2), (4) Date: Jun. 27, 2000

(87) PCT Pub. No.: WO99/04453

PCT Pub. Date: Jan. 28, 1999

(30) Foreign Application Priority Data

Jul. 7, 1999 (DE) ......................................... 197 30 388

(51) Int. Cl.⁷ ......................... H01R 4/02; H01R 12/24; D23K 37/053
(52) U.S. Cl. ...................... 428/623; 428/652; 428/672; 361/749; 174/88 R; 228/44.5
(58) Field of Search ................................. 428/623, 652, 428/672, 591, 594, 620; 361/749; 174/88 R; 228/44.5

(56) References Cited

U.S. PATENT DOCUMENTS

| | | | |
|---|---|---|---|
| 4,371,231 A | * | 2/1983 | Jung |
| 4,814,855 A | * | 3/1989 | Hodgson et al. |
| 5,054,192 A | * | 10/1991 | Cray et al. |
| 5,773,884 A | * | 6/1998 | Andros et al. |

FOREIGN PATENT DOCUMENTS

| | | |
|---|---|---|
| DE | 2945670 B1 | 5/1981 |
| DE | 4132995 A1 | 4/1993 |
| EP | 0814539 A2 | 12/1997 |
| GB | 2 157 085 | * 10/1985 |
| JP | 62-159469 | 1/1989 |
| SE | 459 832 | 7/1989 |

* cited by examiner

Primary Examiner—Deborah Jones
Assistant Examiner—Jason Savage
(74) Attorney, Agent, or Firm—St. Onge Steward Johnston & Reens LLC

(57) ABSTRACT

What is described here is an electrical and mechanical contact consisting of a rigid background, a flat thin bond structure and a bond connection, as well as a method of electrically and mechanically connecting a flat thin bond structure with a rigid background by means of a bond head.

In an approach to permit the production of bond contacts on a minimum of space with the smallest pitch spacings possible up to 50 $\mu$m it is proposed that the bond structure presents a hole and that the bond connection is substantially a bond element which extends from the background through the hole in the bond structure up to a zone located above the bond structure, and that the bond element, in the area located above said bond structure, extends laterally at least partially beyond said hole in said bond structure, thus ensuring the contact of the background with the underside of said bond structure.

In an approach to enable the production in the most simple, time- and cost-saving manner, it is proposed that the bond head is bonded through a hole in the bond structure bond head, for most of its part, is bonded through a hole in the bond structure directly onto the background while the bond structure is pressed by the bond head against the background.

15 Claims, 1 Drawing Sheet

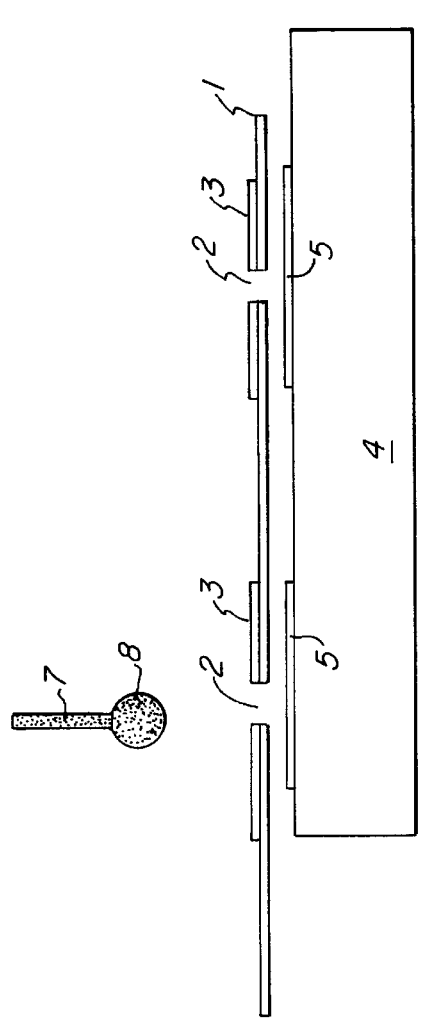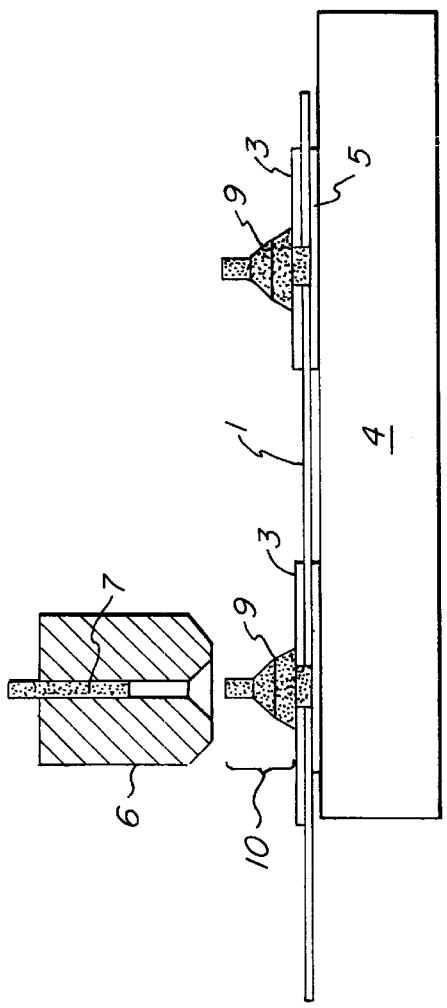

CONTACT AND METHOD FOR PRODUCING A CONTACT

PRIOR APPLICATION

This application is a 371 continuation of PCT/EP98/04412 Jul. 16, 1997 under the International Convention and based on German Application DE 197 30 388.9 filed Jul. 7, 1997.

DESCRIPTION

1. Field of the Invention

The invention relates to a contact for mechanically and/or electrically connecting a first element such as a substrate to a second element by means of a bond structure as well as to a method of producing such a contact, and the application of a corresponding contact or method, respectively.

Such contacts are employed in numerous applications; one preferred application of such contacts is the manufacture of miniaturised connections disposed in a minimum of space. The miniaturised contacts are used, for instance, in microelectronics, neuro-prosthetics or in implant medicine.

In microelectronics, for instance, it is necessary as a rule to interconnect various electronic devices such as integrated circuits, printed circuit boards, substrates, hybrids or the like. The manufacture of such mechanical, electrically conductive connections is usually performed by a method generally designated as "bonding".

For the production of these connections frequently flat thin bond structures are used such as flexible, thin and narrow strip conductors which must be mechanically and hence also electrically connected to the aforementioned devices serving as substrate. Monolithically integrated circuits without a housing and also any other bondable material surfaces may be used as substrate for the assembly of such flexible structures.

In neuro-prosthetics thin flexible strip conductor structures are used which must be connected to the body for stimulating nerves or for deriving nervous signals. Like in implant medicine appropriate demands must be made on the physical compatibility of the materials used for bonding.

Further fields of application may be found wherever flexible bond structures can be employed in particular, such as in the watch-making industry or in consumer electronics, etc.

In the wake of the ever-increasing miniaturisation the spaces between the individual conductors strips and hence also between their contacting areas, i.e. the individual contacts, become ever smaller as well; for example, typical distances between the bonding contacts of adjacent strip conductors, the so-called pitches, are presently ranging at 100 $\mu$m and even less.

2. Prior Art

For the production of so-called bond contacts numerous methods have become known:

In the so-called wire bonding method the connection between two devices is established by a flexible bonding wire which is fastened by means of a wire bonding device in succession on both devices (or on one device and a wiring carrier or the like). Each individual contact is fastened by pressing the bonding wire onto a contacting pad of the respective device and by soldering the wire there by means of ultra sound, thermo compression or any other weld joining technique.

As far as the feed of the bonding wire to the soldering site and the shape of its area to be soldered are concerned two methods are common in particular, the so-called ball bonding technique and the wedge bonding technique:

In ball bonding the bonding wire of the surface to be bonded is fed by means of a bonding capillary at a right angle; the end of the bonding wire which projects from a funnel-shaped flaring section of the bonding wire mount, which faces the device surface, is fused to form a sphere. This sphere fusing is normally done by means of a hydrogen micro flame or by electric spark discharge. The bonding ball so obtained is then applied onto the substrate to be bonded and soldered there in the aforedescribed manner.

The wedge bonding technique is distinguished therefrom by the fact that the bonding wire is fed at an angle of typically 30° to 60° relative to the contact area. Rather than being shaped to form a sphere, the free end of the bonding wire is applied below a base area on the underside of the bonding capillary, which extends approximately in parallel with the contact area of the substrate, which capillary presses the end of the bonding wire under the substrate. In this way the end of the wire piece arrives as "wedge" on the substrate. Soldering is equally done by means of the aforedescribed welding techniques.

As the bond wire serves to interconnect two contact sites the wire bonding technique is either referred to as ball-wedge bonding or as wedge-wedge bonding, depending on the kind of application of the first contact. In the wedge bonding technique the second contact is produced in each case by mounting an appropriately further located segment of the bonding wire, which is already fastened on one end, on the second device and by severing the bonding wire behind the fastening site.

Apart from the wire bonding techniques wherein wires are required as intermediate conductors also methods have become known for producing direct contacts between the bond structures, e.g. the so-called beam lead technique wherein flexible strip-shaped bond structures, the so-called beam leads, which project beyond the edge of the respective device, are mounted on the structures of another device.

This technique—like the wire bonding technique—requires, however, a huge expenditure in terms of material for the bonding material and when materials such as gold are used for bonding they involve correspondingly high production costs.

Even though smaller quantities are sufficient for other techniques in which the bond contacts are created as early as during the manufacture of the devices as such as their components, as a rule—for instance rigid bond mounds are modelled on at lest one of the devices in the flip chip technique, which then establish the contact when the other device is mounted in face-down position—this technique is inexpedient, compared against wire bonding, however on account of the great number of required process steps and process media and as a result of the lower limit of the pitch space of some 200 $\mu$m, which is due to the manufacturing process.

Moreover, the used materials such as SnPb or Cu are compatible with CMOS elements only under certain conditions, and on account of their toxicity they are not suitable for the application in neuro-prosthetics. Apart therefrom, the flip chip technique and even any other simultaneous bonding method is linked up with major interference into the manufacture of the devices—lithography, coating processes, adjustment operations, etc.—directly so that they do not constitute a proper substitute for serial techniques such as wire bonding.

The foregoing considerations have gone to show that the common methods of producing bond contacts involve high costs whenever minute bond contacts are to be produced, which costs are due to the expenditure in terms of material and/or the complex handling or approach, respectively. Furthermore, the known methods involve restrictions also with respect to the achievable minimum pitches.

BRIEF DESCRIPTION OF THE INVENTION

The present invention is based on the problem of improving a contact which provides a mechanical and/or electrical connection of a first part, in particular a solid background such as a substrate, with a second part such as a second substrate or a flat thin strip conductor in particular (referred to as bond structure in the following) by means of a bond connection in such a way that the two parts can be mechanically and electrically connected in the simplest way possible and in a manner saving time and costs, at a pitch as small as down to 50 μm.

One invention solution to this problem is defined for a contact in and for the production method.

The inventive problem is solved for a contact by the provisions that the bond structure presents a hole, that the bond connection is substantially a bond element extending from the background through the hole in the bond structure up to a zone located above said bond structure, and that said bond element, in the area located above said bond structure, extends laterally at least partially beyond said hole in said bond structure, thus ensuring the contact of the background with the underside of said bond structure.

For the production method the problem is solved by the provision that the bond head, for most of its part, is bonded through a hole in said bond structure directly onto the background while the bond structure is pressed by the bond head against the background.

In view of the typical width of strip conductors of 100 μm and less and the equally very thin thickness, the second part is, as a rule, a flat thin and flexible bond structure and presents, like the first part which may be a rigid background in particular, a contacting area suitable for bonding. The hole in the flexible strip conductor (mostly in the centre of the contacting area) allows for the simultaneous contacting of the strip conductor and the background within a minimum of space and in one step of operation. The quantity of consumed material, which is required for bonding, and the expenditure in terms of work and time is correspondingly small.

An ultrasonic welding apparatus is sufficient as equipment for carrying through the inventive method.

In this way, the cost-saving processing of fairly small numbers of units in particular becomes possible, too. Another advantage of the inventive method resides in the aspect that this method is suitable for bonding already the commercially available ICs with their standard aluminium contacts.

The mechanical contact is established by the bond element which is created by deformation of the bond head in the course of the inventive method. This bond head (in the form of a bonding ball or a bonding wedge) is larger than the hole in the bond structure. It is therefore not only pressed as such through the hole on the contacting area of the background but presses also the bond structure against the background outside the hole. As a result, the bond element is given a mushroom-shaped cross-section form in the simplest case during deformation, with the area above the bond structure surface, which corresponds to the head of the mushroom ensures a permanent mechanical contact between the bond structure and the background.

In a first inventive embodiment the feature is provided that the bond structure is conductive on its upper side in the vicinity of the hole so that it is also electrically connected, via the bond element, to the background.

In accordance with a second inventive embodiment the bond structure is conductive on its underside in the vicinity of the hole, contacts the background there, and is electrically connected to the background by this direct contact. In this case the bond element establishes the mechanical connection between the strip conductor and the background, via its area located above the bond structure, and hence ensures also the electrical connection indirectly.

With the bond material being merely pressed or formed, respectively, in the inventive method, any bondable material may be employed on principle.

According to a further embodiment gold is used as bonding material because this metal is used specifically for medical applications on account of its high chemical resistance.

An expedient embodiment of the invention provides for adjustment of the bond structure in parallel with the surface of the background by means of the hole. As the background or its contacting area, respectively, is visible through the hole in the (transparent or even opaque) strip conductor the initially required adjustment of the strip conductor prior to contacting is facilitated in this manner.

Another embodiment presents the feature that the bond head is shaped as bonding ball in a manner known per se by fusing a bonding wire. In this manner it is easily possible to enlarge the diameter of the bond head beyond the diameter of the hole so that the bond structure is covered by the bonding ball in the vicinity of the hole.

BRIEF DESCRIPTION OF THE DRAWING

The invention will now be described in the following, without any restriction of the general inventive idea, by exemplary embodiments with reference to the drawing which explicit reference is made to with respect to the disclosure of all inventive details which are not explained in more details. In the drawing:

FIG. 1 shows a first embodiment, and

FIG. 2 illustrates a second embodiment of the inventive method.

DESCRIPTION OF EMBODIMENTS

In both embodiments a flexible strip conductor (1), which may present a small spacing of the individual contacts in particular, is to be connected to a substrate (4) or any other solid background. To this end, the strip conductor (1) has holes (2) at the contacting locations.

In both embodiments, the substrate (4) is provided with contacting areas (5) for the bonding operation in the vicinity of the holes (2) on the upper side. Additionally or in an alternative, the strip conductor may present complementary contacting areas (3) on its upper side and/or underside.

The flexible strip conductor (1) is so adjusted relative to the substrate or the underside (4), respectively, that the respective contacting areas (3) and (5) are approximately registered in congruence one above the other. Bonding is performed through the hole (2) in the strip conductor (1).

In the first embodiment illustrated in FIG. 1 a ball (8) is fused on a bonding wire (7) by means of ball fusing.

In the embodiment shown in FIG. 2 a bonding wire (7) is made available by a bonding capillary (6) by means of a wire bonding operation.

The bonding capillary (6) is flared in the form of a funnel in the feeding direction, i.e. on the side facing the strip conductor. On the end of the bonding wire (7), which projects therefrom, a bond head (8) is produced, equally by ball fusing. This head is positioned above a hole in the strip conductor and pressed against the strip conductor or the background, respectively. In this operation the bond head is shaped during the pressing step so as to form a bond element (9) whilst a permanent connection is established between the bond element and the strip conductor and the background by ultrasonic welding.

The shape of the bond element in the area (10) located above the strip conductor is characterised by the funnel-shaped flared section of the bonding capillary and is so formed that it covers the contacting area of the strip conductor at least partly in the vicinity of the hole. When the bonding capillary is removed from the bond connection just produced the bonding wire is torn off at a short distance above the bonded connection and can be fed again for the next contacting step.

In an alternative, the bond head may be formed by non-cutting shaping of an aluminium wire.

What is claimed is:

1. A bonded structure comprising:
   a first substrate having an upper face;
   a second substrate having an upper face and a lower face, said second substrate being a narrow and flexible strip conductor provided with one through hole extending from said upper face of said second substrate to said tower face of said second substrate;
   a bonding element in contact with said upper face of said first substrate and extending through said through hole and laterally beyond said through hole for providing a connection between said first substrate and said second substrate, said bonding element being directly bonded to said upper face of said first substrate; and
   wherein
   said bonding element further includes a bond head being larger than said through hole and being deformed to press said second substrate against said first substrate to provide a mechanical connection between said first substrate and said second substrate, said bond head being a bonding material pressed into said through hole.

2. A bonded structure according to claim 1, wherein said bonding element provides an electrical connection between said first substrate and said second substrate.

3. A bonded structure according to claim 2, wherein the upper face of said second substrate is electrically conductive in the vicinity of said one through hole to electrically connect said substrate to said first substrate via said bonding element.

4. A bonded structure according to claim 2, wherein the lower face of said second substrate is electrically conductive in the vicinity of said one through hole to electrically connect said second substrate to said first substrate.

5. A bonded structure according to claim 1, where said second substrate further is a flat thin strip conductor.

6. A bonded structure according to claim 5, wherein said second substrate is a narrow and flexible strip conductor.

7. A bonded structure according to claim 1, wherein a plurality of individual connections are provided between said first substrate and said second substrate at spacing of less than 100 $\mu$m from each other.

8. A bonded structure according to claim 1, wherein said bonding element consists of gold.

9. A bonded structure according to claim 1, wherein said bonding element consists of aluminum.

10. A method for producing a bonded structure, comprising the steps of:
    providing a first substrate having an upper face;
    providing a second substrate having an upper face and the lower face, said second substrate being a flexible and narrow strip conductor;
    providing one through hole extending from said upper face of said second substrate to said lower face of said second substrate;
    inserting bonding materials into the through hole for providing a connection between the first substrate and the second substrate;
    bonding the upper face of the first substrate to the second substrate by pressing the bonding material into the through hole to form a bond head outside the through hole.

11. A method according to claim 10, further comprising the step of adjusting the second substrate relative to the first substrate such that the through hole is aligned with a select area of the first substrate.

12. A method according to claim 10, further comprising the step of fusing a bonding wire into a shape of a ball for use in forming the bond head.

13. A method according to claim 12 wherein the bond head is formed from an aluminum wire by a method which does not require a cutting step.

14. A method according to claim 10 wherein the first substrate is a rigid substrate.

15. A method according to claim 14, wherein the strip conductor has a width of less than 100 $\mu$m.

* * * * *